United States Patent [19]
Caddock et al.

[11] Patent Number: 5,358,169
[45] Date of Patent: Oct. 25, 1994

[54] METHOD OF SOLDERING LEADS TO ELECTRICAL COMPONENTS

[75] Inventors: Richard E. Caddock; Robert C. Bowen, both of Roseburg, Oreg.

[73] Assignee: Caddock Electronics, Inc., Riverside, Calif.

[21] Appl. No.: 182,215

[22] Filed: Jan. 14, 1994

[51] Int. Cl.5 ............... B23K 31/02; H01L 21/60
[52] U.S. Cl. ............. 228/180.1; 228/224; 228/249; 228/902; 437/182; 437/205
[58] Field of Search ............ 228/180.21, 224, 245, 228/246, 249, 902, 180.1; 29/827, 860, 879; 437/182, 205

[56] References Cited

U.S. PATENT DOCUMENTS

| | | | |
|---|---|---|---|
| 3,750,252 | 8/1973 | Landman | 228/180.21 |
| 4,484,704 | 11/1984 | Grassauer et al. | 228/180 A |
| 4,724,995 | 2/1988 | Zettl | 228/218 |
| 5,040,717 | 8/1991 | McGaffigan | 228/56.3 |
| 5,180,097 | 1/1993 | Zenshi | 228/180.21 |
| 5,252,944 | 10/1993 | Caddock, Jr. | 338/275 |
| 5,254,969 | 10/1993 | Caddock, Jr. | 338/308 |
| 5,271,549 | 12/1993 | Tohyama | 228/249 |

OTHER PUBLICATIONS

Schunk Automation AG, *Higher Cost Saving Potential In Assembly Through Automated Soldering Technology*, Nov. 1992, Brügg/Biel, Switzerland.

Ernest Spirig Company, *The Best Choice! . . . SPIRFLAME®* (Catalog Sheet), Sep. 1993, Rapperswil, Switzerland.

*Primary Examiner*—Samuel M. Heinrich
*Attorney, Agent, or Firm*—Richard L. Gausewitz

[57] ABSTRACT

A method of soldering leads to electrical elements, such as resistors, in which a ribbon of solder, having a coating of flux, is sandwiched between a plurality of electrical elements and a plurality of leads. Hydrogen flames then cut the ribbon at points between the electrical elements and also between the leads. The hydrogen flames are then directed at the leads to melt the solder and cause extending portions of the ribbons to be drawn towards the leads.

32 Claims, 4 Drawing Sheets

METHOD OF SOLDERING LEADS TO ELECTRICAL COMPONENTS

BACKGROUND OF THE INVENTION

In the manufacture of electrical components, such as the film-type resistors shown by U.S. Pat. No. 5,252,944, the soldering of the leads to the chips is tedious and expensive. For example, as described in the cited patent, a separate screen-printing step may be required in order to apply a solder composition to the chip, following which lead ends are clamped onto the chip at the solder composition and the assembly is heated to effect melting of the solder.

It is desired that a method be provided by which the leads may be properly and strongly and rapidly applied with just the right amount of solder for each connection, and which does not require a screen-printing operation.

It is also common in the prior art to wash resistors, etc., in solvents in order to remove excess flux therefrom; it is desired to provide a method by which no such washing is necessary.

It is also desired to provide a method by which soldering of leads onto resistors and other components may be achieved relatively rapidly, and at least semiautomatically, yet effectively and strongly with the desired amount of solder for each connection.

It is desired to provide a semiautomatic or automatic method that will create solder bonds, between leads and chips, that are often stronger than those conventionally achieved by prior-art soldering methods for connecting leads to chips.

It is further desired to provide a method that is highly controllable and manageable, in comparison to prior-art methods, that does not require screen-printing, or solder paste, and in which the solder flows towards the desired bond region in response to a particular step in the method.

SUMMARY OF THE INVENTION

In accordance with one aspect of the present invention, a method is provided by which solder in ribbon form is employed in a highly practical and effective manner that rapidly and strongly solders leads to chips.

In accordance with another aspect of the invention, the solder ribbon is pre-coated with flux of a no-clean type, which facilitates the soldering operation and at the same time eliminates the need for washing the resulting product in a solvent.

In accordance with another aspect of the present invention, there is provided a method by which flames are employed in conjunction with solder in order to achieve not only rapid and effective soldering but also a reducing action that is believed to increase the strength of the resulting solder joints.

In accordance with another aspect of the invention, flames are employed both for cutting solder ribbon and for heating the leads at regions remote from the cut points, it being an aspect of the invention that the solder is drawn from the cut points towards the joint regions.

In accordance with another aspect of the invention, the thickness and width of the solder and the distance between the chips being soldered are so calculated that the desired amount of solder is present at the inner end portion of each lead.

In accordance with another aspect of the invention, torch tips are employed in such sequences that different solder regions are automatically cut, following which parts to be soldered are automatically heated, the relationships being so determined that the cut solder flows towards the joint regions in proper amount and location.

In accordance with another aspect of the invention, mechanisms are provided to effect movements of various torch tips to desired points on both x and z axes. An apparatus is also provided to locate precisely the components and the lead frames to be connected by soldering.

DETAILED DESCRIPTION

Throughout this specification and claims the word "ribbon" denotes a thin flexible strip or tape of solder that is long in comparison to its width. It has opposed surfaces (upper and lower) that are normally parallel to each other, and edges that are also normally parallel to each other.

Figure 5:
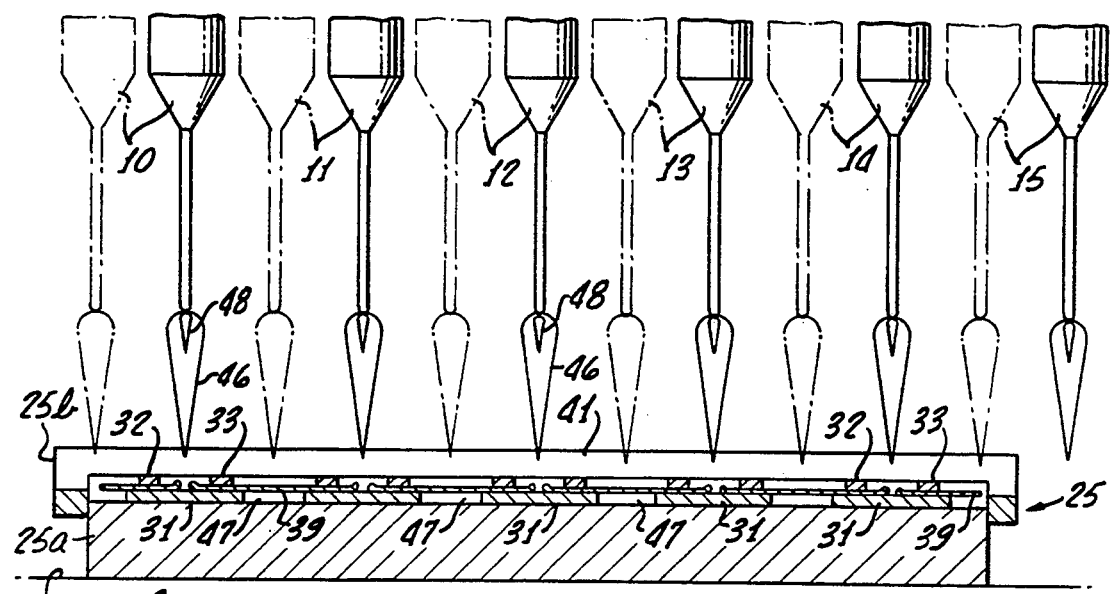
FIG. 5 is a sectional view showing in solid lines the bank of torch tips and flames, effecting cutting of solder positioned on chips, and showing in phantom lines the bank after being moved to positions for cutting of solder between chips.
Figure 6:
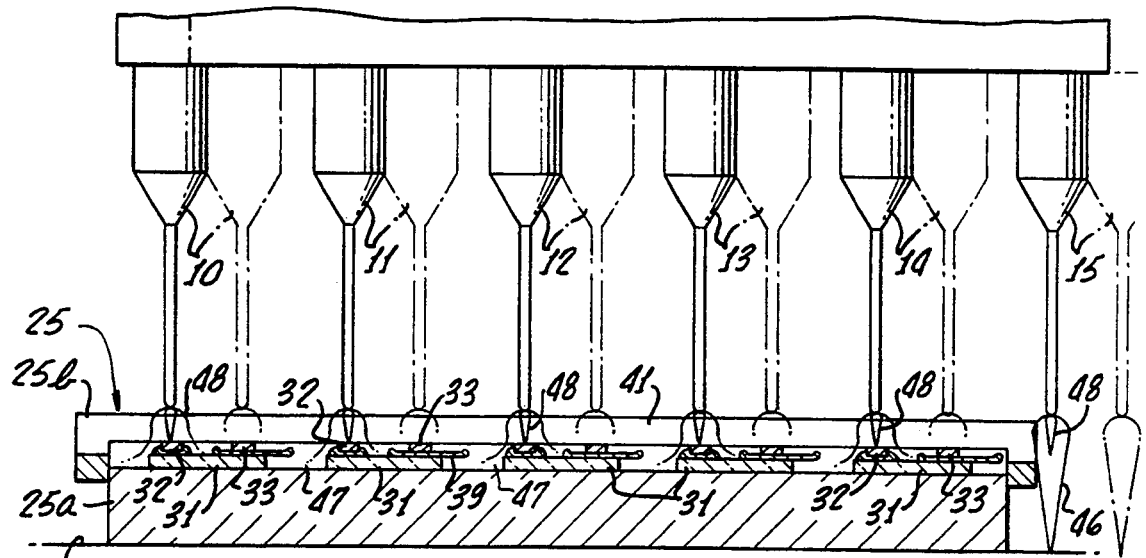
FIG. 6 is a sectional view illustrating in solid lines the bank of torch tips and flames effecting heating of one lead on each chip, and in phantom lines the same bank effecting heating of the remaining lead on each chip.

Throughout this specification and claims the convention is used that-as viewed in FIGS. 5 and 6—the "x" direction is left-to-right or right-to-left, the "z" direction is vertical, and the "y" direction is perpendicular to the plane of the paper containing FIGS. 5 and 6.

For purposes of illustration, and in the preferred embodiment, the method and apparatus are employed in soldering the leads to the chip in a film-type electrical resistor, such as the one described in U.S. Pat. No. 5,252,944. Said patent is hereby incorporated by reference herein.

Figure 1:
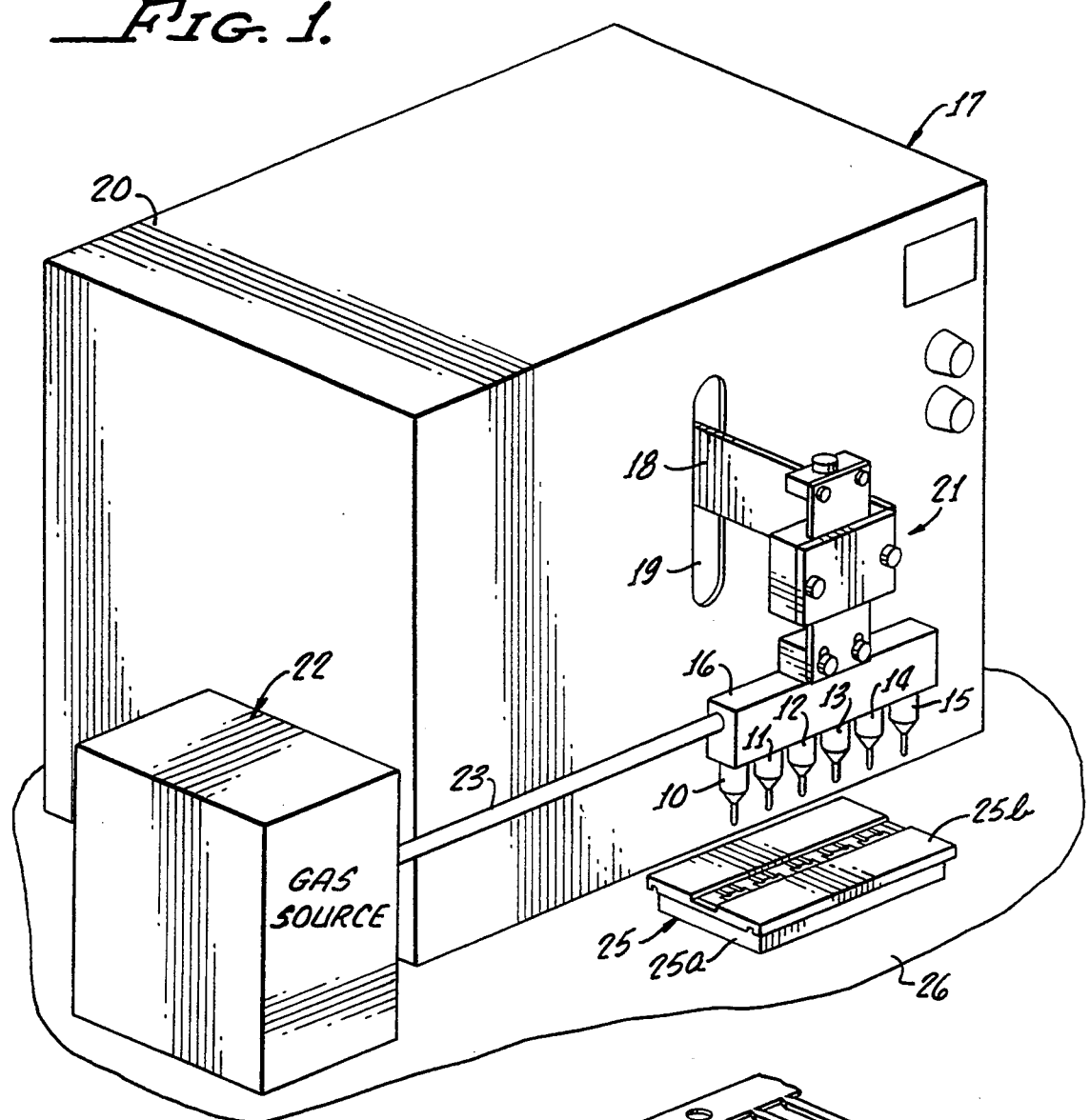
FIG. 1 is an isometric view showing five resistors, in a fixture, being flame soldered by a bank of torch tips.

Referring first to FIG. 1, there are shown a plurality —illustrated as six—of identical torch tips (burner nozzles) 10–15 mounted in spaced dependent relationship from a manifold 16. In the illustrated embodiment, the torch tips 10–15 are equally spaced along a straight line. The spacing is correlated to (equal to) the center-to-center spacing between chips when the chips are in positions to be soldered.

Manifold 16, in turn, is adjustably supported in horizontal position from an actuating mechanism 17 that effects programmed movements of manifold 16 in both x and z directions. Stated more definitely, the mechanism 17 connects to an arm 18 that extends generally horizontally through a slot 19 in a housing 20. Such arm, in turn, connects to an adjustment means 21 that is secured to the manifold 16. The adjustment means is so constructed as to permit fine adjustments of the positions of manifold 16 both horizontally and vertically. Slot 19 is sufficiently high and wide to permit the x and z motions of arm 18.

The actuating mechanism may be of various types, one preferred mechanism incorporating cams to achieve the desired x–z motions of arm 18, manifold 16 and thus tips 10–15.

A gas source, represented schematically at 22, connects through a flexible conduit 23 to manifold 16 and thus to the torch tips. To generate hydrogen flames at the tips, these being the preferred heat sources (heating means), two volumes of hydrogen gas and one volume of oxygen gas are supplied to the manifold from source 22. Preferably, the indicated gas mixture is bubbled through a volatile organic liquid, such as methanol, ethanol, acetone, methyl ethyl ketone, hexane or heptane, to introduce additional flammable vapors into the gas stream. Such addition of organic vapors to the gas mixture increases the heat content of the flames and increases the reducing ability of the flames—reducing being a distinctly desired characteristic of each flame. The pressure of the mixed gases, when used with the torch means described above and below, should be kept between 10 and 15 kilopascals (1.45 and 2.18 psi), preferably between 11 and 12 kilopascals (1.60 and 1.74 psi).

Each of the torch tips 10–15 comprises a stainless steel tube between 23 gauge (0.0125 inch, 0.318 mm ID) and 27 gauge (0.0076 inch, 0.193 mm ID). In the specific examples described herein, a 25-gauge (0.0095 inch, 0.241 mm ID) torch tip is preferred.

In the illustrated example of the invention, a fixture 25, containing precisely located parts to be soldered, is positioned (by locating means, not shown) on a horizontal support surface 26. In the illustrated form, support surface 26 also supports actuating mechanism 17 and gas source 22. It is to be understood that there are a plurality of identical fixtures 25, so that one fixture and its contents may be positioned beneath the tips 10–15 while others are being loaded and preheated.

Figure 2:
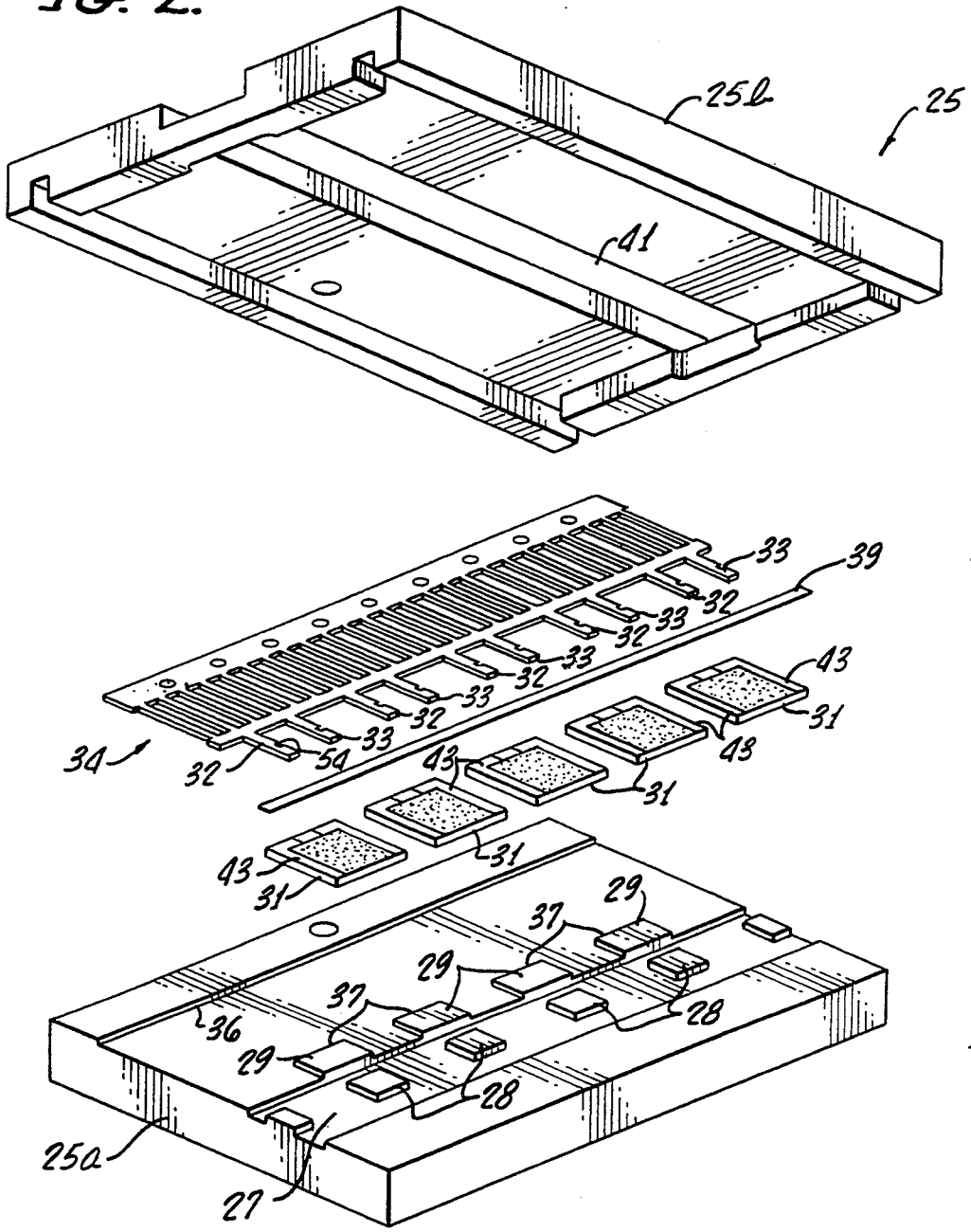
FIG. 2 is an exploded isometric view showing upper and lower fixture portions, a lead frame, a solder ribbon, and five chips to be soldered.

Referring to FIG. 2, each of the identical fixtures 25 consists of a metal base 25a and a metal lid 25b, the preferred metal being aluminum. Formed in base 25a is a shallow groove 27, there being small spacers 28 provided in equally-spaced relationship along the length of the groove. The relationships are such that five (in the illustrated embodiment) identical chips 31—for example, of the type described in the cited patent—are positioned in groove 27 between the respective small spacers. Large spacers 29 are provided immediately adjacent groove 27 and serve to position wide lead portions 32, 33 (hereinafter called "leads") of a lead frame 34. The respective spacers 28, 29 are not close to each other, being instead spaced apart by distances larger than the width of the solder ribbon. A wall 36 in base 25a locates the edge of lead frame 34 remote from leads 32, 33. Correspondingly, walls 37 of large spacers 29 locate the opposite (parallel) edges of the lead frame.

Figure 3:
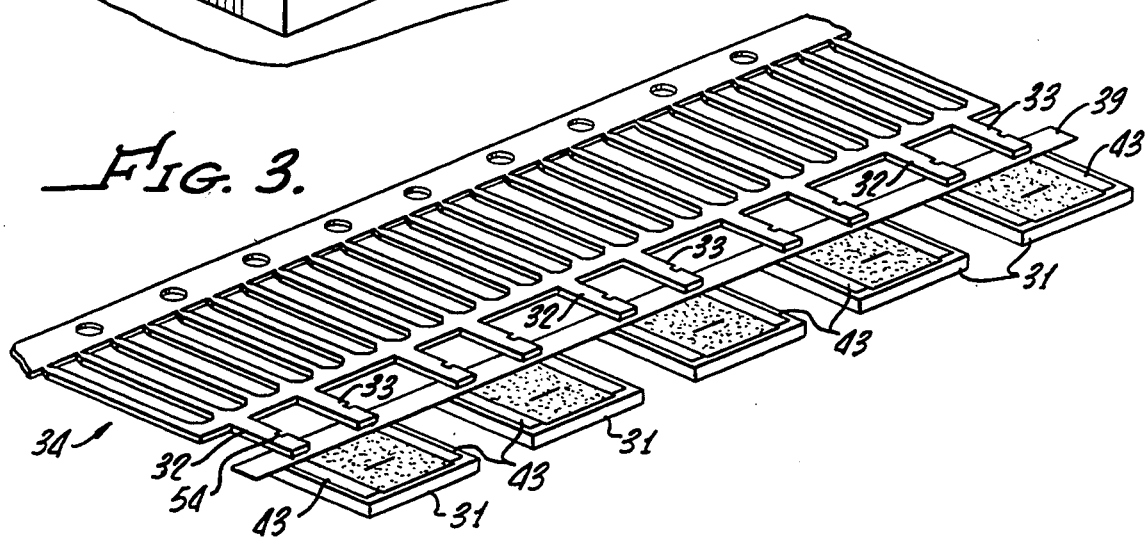
FIG. 3 is an isometric view showing the components in the positions they are when assembled in the fixture of FIG. 2.

The large spacers 29 are substantially higher than are the small spacers 28, the latter being substantially flush with the upper surface regions—of base 25a—that lie on opposite sides of groove 27. Those edges of large spacers 28 perpendicular to walls 37 serve to position the various sets 32, 33 of leads. Thus, each lead set 32, 33 is registered with a chip 31 and partially overlaps the same as shown in FIG. 3 hereof.

In the present example, the lead frame and thus leads 32, 33 are 0.023 inch thick, being formed of copper that is electroplated with nickel. Also in the present example, each lead 32, 33 is 0.040 inch wide. The top and bottom surfaces of the lead frame, and leads, are flat and parallel to each other.

Base 25a also receives and positions the ribbon 39 of solder. More specifically, one edge of such ribbon is disposed against and located by walls of large spacers 29 that are parallel to the illustrated walls 37, the ribbon being disposed over the chips.

The lid 25b of fixture 25 is shaped to fit snugly over base 25a in light press-fit relationship after loading has occurred. The relationships are such that lid 25b presses leads 32, 33 lightly down on solder ribbon 39 which, in turn, is sandwiched in flatwise engagement with the leads and with those edge portions of chips 31 that are nearest lead frame 34. The light pressure engagement urges ribbon 39 downwardly so as to cause effective wetting of the opposed surfaces by the solder, and to minimize the chances that air pockets will be formed.

A groove 41 is provided through lid 25b and is located so as to expose the solder ribbon 39 and also expose much of leads 32, 33.

Description of the Remaining Portions of the Method, With the Illustrated Exemplary Workpieces The first step in the method is to assemble a flux-coated solder ribbon 39 in sandwiched relationship between chips 31 and the leads 32, 33 that are to be soldered to the chips. For relatively low-volume (semi-automatic) production, the sandwiching and positioning are achieved using the above-described fixture 25, which (as previously stated) also applies a light pressure holding the solder ribbon closely between the leads and chips. For relatively high-volume (automatic) production, such sandwiching and positioning may be achieved using a continuous lead frame 34, using part shuttles to move the chips 31 into the correct relationship to the leads 32, 33, and using a continuous reel of flux-coated solder ribbon. Also for such high-volume production, automatic clamps hold the leads against the chips with the solder ribbon sandwiched between them. Also for such high-volume production, index means—including holes in the lead frame—are associated with lead frame 34 to advance it in timed relationship relative to operation of the manifold 16 and the associated torch tips 10–15. (It is pointed out that "low-volume" and "high-volume" relate to each other; even low-volume is faster than the prior-art method of making the article described in the cited patent.)

FIG. 3 shows the indicated sandwiched relationship for both low-volume and high-volume production. Thus, for example, FIG. 3 shows the positions of the various components after the loaded fixture 25 of FIG. 2 has been closed. It is pointed out that both ends of the ribbon 39 protrude from the outermost leads by predetermined distances. Each such distance correlates substantially to half the distance between adjacent leads of adjacent chips 31.

Figure 2A:
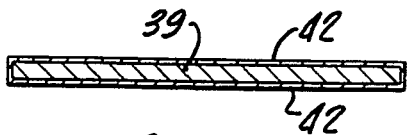
FIG. 2a is a greatly enlarged cross-sectional view, not to scale, of the solder ribbon.

The ribbon 39 is precoated with flux 42, as shown in greatly enlarged form in FIG. 2a. Such flux 42 is a suitable no-clean flux.

In accordance with one aspect of the method, the chips 31 are caused to be sufficiently close together that when solder ribbon 39 is cut midway between proximate chips, the solder ends and molten solder will not merely drop but instead be drawn towards the chips. The solder ends are thus in positions to flow properly in response to the heating step described below. The chips are caused to be sufficiently far from each other that there will be desired amounts of solder on both sides of each lead 32, 33 after completion of the soldering operation. As a specific example, for a relatively "large" chip 31, having a dimension of about 0.33 inch by about 0.35 inch, the spacing between adjacent parallel edges of proximate chips is about 0.17 inch.

The described sandwiching of ribbon 39 and positioning of leads 32, 33 relative to the chips 31 are such that at least the ends of the leads register with, and are accordingly connected by soldering to, highly conductive metalized soldering pad portions 43 of the chips. The illustrated pads, for the chip size stated in the preceding paragraph, are L-shaped, and the ends of leads 32, 33 register in each case with inwardly-extending "lower" portions of the L-shaped pads.

Figure 4:
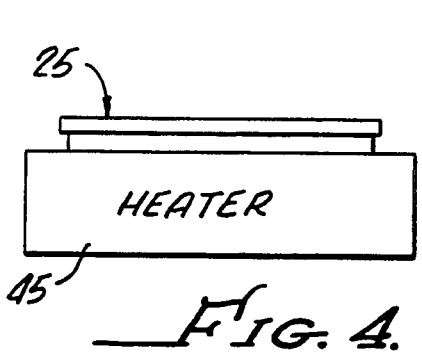
FIG. 4 is a schematic representation of a heating element employed relative to the components of FIG. 2 after they have been assembled.

As the next step in the preferred embodiment of the present method, at least the chips 31 are preheated to a temperature in the range of 100° C. to 200° C., depending on the melting point of the particular solder being used. When the fixture 25 is employed, such preheating is effected by placing the closed fixture containing the indicated components onto heating elements, one of which is represented schematically at 45 in FIG. 4. As previously indicated, a plurality of fixtures 25 are loaded, closed and preheated, while another loaded fixture is beneath the tips 10–15 during an actual soldering operation. In such case, therefore, everything is preheated. For the high-volume method indicated above, only the chips 31 are preheated.

Referring next to FIG. 5, let it be assumed that a preheated, loaded fixture 25 is in its predetermined position beneath the torch tips. A sequence (cycle) of motions is then performed, for example, by using the actuating mechanism 17 (FIG. 1.)

The first motion is such as to cause the flames 46 from torch tips 10–15 to simultaneously cut the solder ribbon 39 at spaced points. In the illustrated example, the first cuts are effected by the solid-line tips, shown by solid lines in FIG. 5, and cut the regions of ribbon 39 on chips 31 midway between leads 32, 33 thereon. The described cutting causes the solder to draw up into a ball on each side of each cut. The thus-cut ends of the solder ribbon thus separate from each other by about ⅛ inch.

As the next motion, the tips and flames are moved to the phantom-line positions in FIG. 5, and ribbon 39 is thus cut midway between proximate chips 31. This causes the solder to draw up into a ball on either side of each cut and be separated by (for example) ⅛ inch. It is pointed out that each protruding end (left and right ends in FIG. 3) of the ribbon is not, in the relatively low-volume method using fixture 25, cut but is caused to be drawn into a ball.

As shown in FIG. 5, and with the actuating mechanism 17 being used, the flames 46 are relatively high—in relation to the ribbon 39—during each cutting operation. In the preferred form of the method, each flame is caused to be only sufficiently close to the ribbon 39 to effect the indicated cutting and balling.

When being moved between the solid-line and phantom-line positions in FIG. 5, by the actuating mechanism 17 of FIG. 1, the torches and flames are first raised high and subsequently moved sideways and then lowered, instead of only moving sideways. It is pointed out, however, that in another embodiment the movements of the torches, and thus the flames, are horizontal instead of vertical, or the movements may be in inclined directions. The latter movements (stated in the preceding sentence) are such that the flames move between positions at which they do not affect the solder or chips or leads, and positions at which they effect ribbon cutting or (relative to the below-described next step) lead heating (for bonding or soldering). In such indicated other embodiment where the movements of the torches and flames are horizontal instead of vertical, cutting is achieved by reducing dwell time when melting the solder for cutting purposes—with the torch tips being at the same height as when bonding or soldering is being effected (the dwell time for bonding or soldering being longer than the dwell time for cutting).

In the above-stated example of ribbon cutting, using the described torches and the actuating mechanism 17, the ends of the torch tips should be located at between 0.25 inch (6.4 mm) and 0.75 inch (19.1 mm), and preferably at between 0.4 inch (10.2 mm) and 0.6 inch (15.2 mm). All of these distances are measured using the upper surface of lead frame 34 (and of leads 32, 33) as the reference plane.

During the described cutting step, the dwell time of each torch in the lowered position (or y-moved position where the other type of actuating mechanism is employed) should be between 0.1 and 5 seconds, and preferably between 0.15 and 2.5 seconds. Too short a dwell time does not allow enough time for complete melting and cutting of the ribbon. Too long a dwell time causes excessive heating of chips 31 and fixture 25, excessive melting of ribbon 39, and oxidation of such ribbon.

It is pointed out that, as shown in FIG. 5, there are six torches for five cuts. In the second (phantom-line) position in FIG. 5, two torches—numbers 10 and 15—at the ends of the fixture are employed relative to the protruding ribbon ends. Means, not shown, are provided to shield the elements from such end torches during all intervals (including those discussed below in reference to FIG. 6) when they are not actually effecting balling of the ribbon ends or effecting bonding.

It is preferred that the spaces over which ribbon 39 extends, when bridging from chip to chip, be air spaces 47 (FIG. 5) instead of being filled such as with the metal of fixture 25. This reduces the heat-sinking action of the fixture so that more heat goes into the ribbon 39.

The individual sections of ribbon, resulting from the cutting step, do not move at all—being clamped in sandwiched positions by the leads 32, 33.

Referring next to FIG. 6, there are shown the bonding or soldering steps of the method. Here, the flames are caused to be much nearer the leads and the solder ribbon than was described above relative to FIG. 5 (or, as stated above relative to the embodiment where the torches are moved in the y direction instead of the z direction, instead of causing the flames to be nearer the leads, there is caused to be longer dwell time).

As shown in FIG. 6, the flames from torches 10–15 are brought closely adjacent the upper surfaces of leads 32, 33. This provides more intense heat to the terminals, solder and metalized pads 43, to create the solder bonds. The previously cut regions of tape 39 are drawn—flow—to regions closely adjacent the leads 32, 33 to strongly secure and electrically connect the same to pads 43, but very preferably without causing any solder to be present on the upper surfaces of the leads.

In the illustrated example, as shown by the solid-line torches in FIG. 6, the leads 32 are first (by the third motion of the cycle) simultaneously soldered to the underlying pads and chips. Then, the leads 33 are soldered to the pads and chips after the torches have been moved to the phantom-line positions by the fourth motion in the cycle. As indicated above relative to FIG. 5, when actuating mechanism 17 is used, the torches are not merely moved sideways; instead, they are lifted high and then moved sideways and then lowered.

In each instance during the described bonding, each torch 10–15 is lowered far enough that the reducing portion of the flame 46 at least partially engages the lead. Each such reducing portion (cone or core) of each flame is indicated at 48. By causing the reducing portion of each flame to be close to the bond area, oxidation is retarded, and solder flow and wetting are enhanced.

Each flame heats the adjacent pad 43 and the solder ribbon and the lead portion 32 or 33, which causes the molten solder to flow towards each lead portion and to wet both the pad and the lead. Each flame is then lifted away from the lead, following which the molten solder rapidly loses heat and solidifies. This forms strong and effective electrically conductive bonds between leads 32, 33 and pads 43.

During lead bonding, the extreme tips of the torches should be between 0.010 inch (0.25 mm) and 0.200 inch (5 mm), and preferably between 0.020 inch (0.50 mm) and 0.08 inch (2 mm), above the upper surface of lead frame 34 and of leads 32, 33.

During the bonding steps, the dwell time of each torch in the lowered position should be between 0.25 and 3 seconds, and preferably between 0.5 and 1.5 seconds. An excessively short dwell time does not allow enough time for the solder to flow and to wet the bond areas. An excessively long dwell time allows molten solder to form inter-metallic compounds with the bond-pad metalization 43, thereby weakening the bond. In the illustrated example, the distance between the centers of the two leads 32, 33 for each chip 31 is 0.200 inch. However, also in the example, the distance between lead 33 for one chip and the nearest lead 32 for the next chip is substantially greater than 0.200 inch. Accordingly, the length of cut ribbon outboard of the leads is, in each instance, somewhat greater than the length of cut ribbon inboard of the leads. However, it has been found that the solder flows to the lead ends and adjacent the lead ends and effectively bonds them to the chips, despite the somewhat unbalanced nature of the quantities of solder on opposite sides of each lead end.

The thickness and width of solder ribbon 39 are caused to be such that the volume of solder present at each lead end is sufficient to effect a strong and complete bond, but (as above stated) insufficient that there will be solder on top of the lead. In the illustrated specific example, solder ribbon 39 is 0.060 inch wide and 0.002 inch thick.

The preferred solder ribbon is made of a major portion of tin and a minor portion of silver; more specifically, about 95% tin and about 5% silver.

Figure 8:
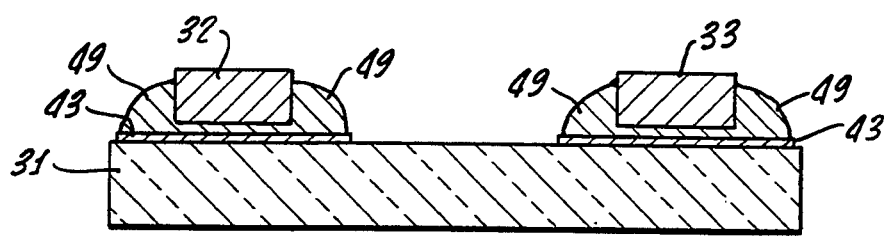
FIG. 8 is a greatly enlarged transverse sectional view showing a chip with two leads soldered thereto.
Figure 7:
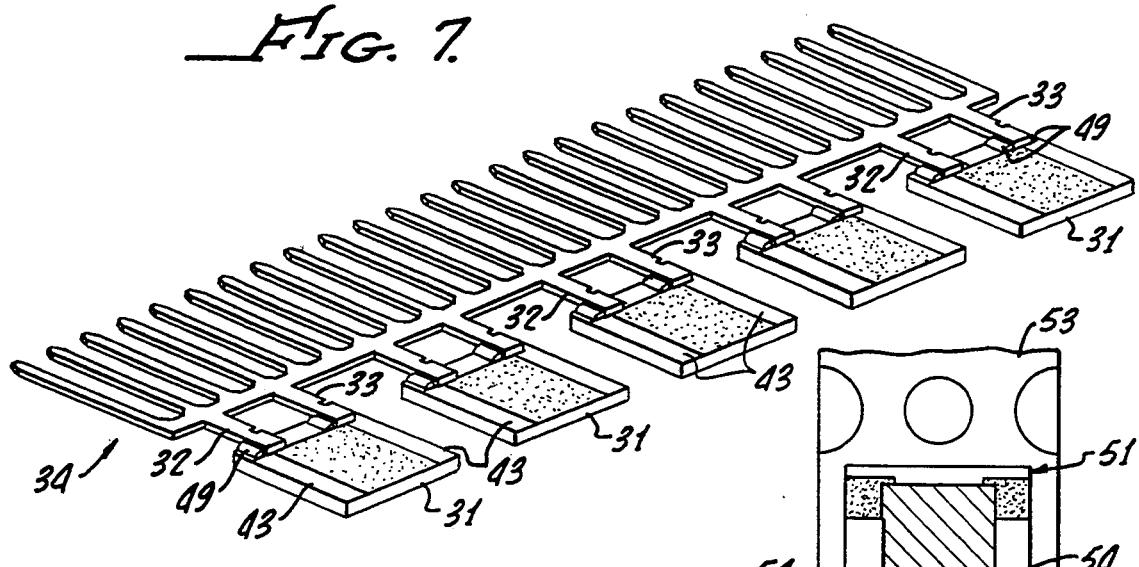
FIG. 7 corresponds to FIG. 3 but shows the condition of the parts after completion of soldering, a portion of the lead frame being unshown.

Referring to FIGS. 7 and 8, there is shown the result of the above-described method, there being dense solidified solder on opposite sides of and beneath each lead end. The solidified solder is numbered 49 (FIG. 8).

Fixture 25 is then removed and unloaded, and a subsequent loaded and preheated fixture 25 is moved into position for the soldering cycle. During the time required for this, the flames are directed or moved away from the fixture area or, alternatively, shield means are interposed between the flames and the fixture area so as to shield the latter from heat.

Figure 9A:
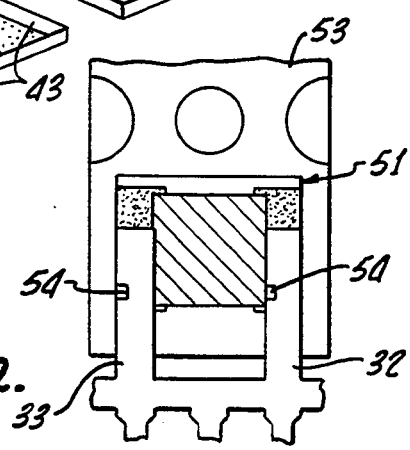
FIG. 9a is an enlarged plan view showing one of the resistors of FIG. 9, but with the housing broken away to show the chip.
Figure 9:
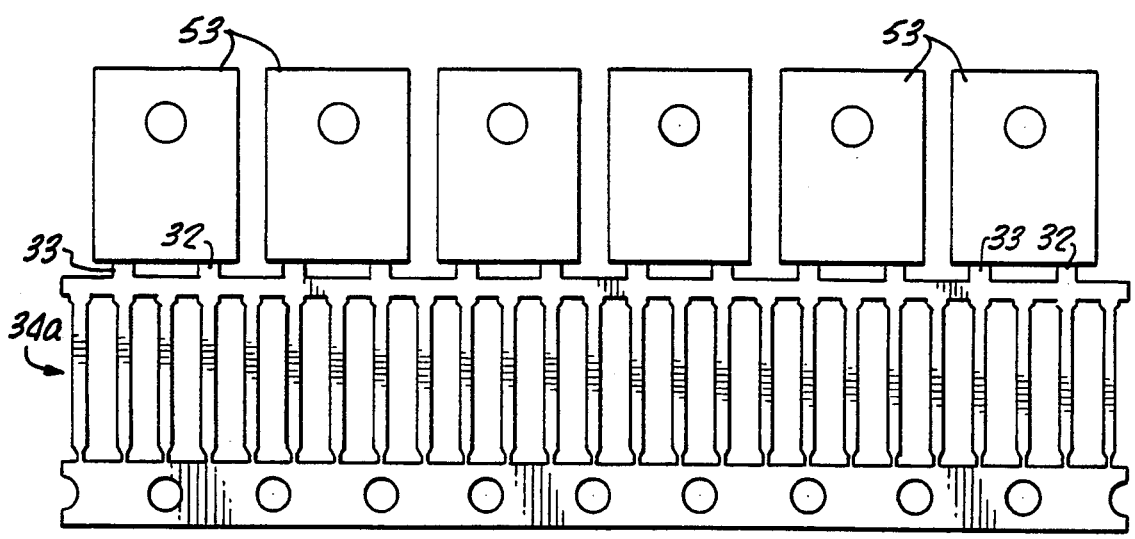
FIG. 9 is a plan view showing a modified resistor and lead frame, and showing synthetic resin housings on the chips.

Embodiment of FIGS. 9 and 9a

Referring to FIG. 9a, the illustrated chip 51 is smaller than chip 31 indicated above. Thus, each chip is about 0.25 inch long (measured perpendicular to the leads) and about 0.19 inch wide. However, the spacing between the leads 32 and 33 for each chip is the same in FIG. 9a as in FIGS. 1–8. Thus, leads 32, 33 in FIG. 9 are spaced 0.200 inch on centers; and the outer edges of the leads substantially register with the edges of the chip.

In addition, and again as shown at the left in FIG. 9a, there is much greater overlapping between the leads 32, 33 in FIG. 9 than in FIG. 3. Thus, as shown in FIG. 9a, each lead overlaps the chip approximately two-thirds of the way to the inner edge of the chip. The underlying metalization pads in FIG. 9a are not L-shaped, but instead straight lines along the edges of the chips.

The lead-pad bonds in the example of FIG. 9a are formed identically to what is described in detail above relative to the embodiment of FIGS. 1–8.

In the FIG. 9a example, the solder wicks or capillates inwardly (away from the lead frame) so as to be beneath substantially the full lengths of the portions of leads 32, 33 that overlie the chips. Accordingly, long and strong bonds are achieved even though the solder ribbon was originally (prior to the cutting and bonding steps described above) only at the outer portion of each chip.

In the embodiment of FIG. 9, the lead portions 32, 33 are equally spaced along the lead frame 34a, which means that the lengths of the cut solder regions on opposite sides of each lead are equal, instead of unequal as was the case in the preceding embodiment.

FIG. 9 illustrates the results of a molding step which can be employed relative to all embodiments of the invention. Rectangular molded bodies 53 of synthetic resin are molded onto the leads and chips while they are still on lead frame 34a. To increase further the strength of the connection between the leads and the molded bodies, notches 54 are formed in each lead as shown in FIGS. 3 and 9a.

After completion of the described molding (or if there is no molding), the lead frame 34a (or 34, in the first embodiment) is cut away to leave only the leads 32, 33 and their narrower extensions that are respectively coaxial therewith. Reference is made to the cited patent, which shows the separated leads.

Where cylindrical leads are employed, they are first suitably secured to a cardboard or other strip, in proper relationship. Very preferably, at least the end portions of the leads—where soldering occurs—are preflattened on the bottom (chip) side.

The foregoing detailed description is to be clearly understood as given by way of illustration and example only, the spirit and scope of this invention being limited solely by the appended claims.

What is claimed is:

1. A method of soldering a lead to an electrical element, which comprises:
   (a) providing an electrical element having an attachment region for a lead;
   (b) providing a lead having an attachment surface adapted to engage said attachment region;
   (c) providing a ribbon of solder having a precoating of flux thereon, said ribbon being longer than the width of said lead;
   (d) sandwiching said ribbon between said attachment region and said attachment surface, and so that a portion of said ribbon extends out instead of being sandwiched between said region and surface; and
   (e) directing a flame at said lead in the vicinity of said attachment surface, at a sufficient temperature and for a sufficient time to melt said solder ribbon and draw said extending portion thereof toward said sandwiched elements, to strongly bond said lead to said element.

2. The method of claim 1, in which said method further comprises causing said attachment region and attachment surface to be substantially flat.

3. The method of claim 2, in which said method further comprises employing as said ribbon of solder a ribbon having such a length, width, and thickness that there is sufficient solder to strongly bond said lead to said element, but insufficient solder to cause solder to flow over the top of said lead.

4. The method of claim 1, in which said method further comprises pressing said lead towards said element during said melting step.

5. The method of claim 1, in which said method further comprises employing as said flame, a hydrogen flame.

6. The method of claim 1, in which said method further comprises employing as said flame, a flame having a reducing core, and further comprises causing said core to be close to said lead during said melting step.

7. The method of claim 1, in which said method further comprises employing as said lead, a copper lead plated with nickel, and employing as said solder ribbon, a solder ribbon that contains a major portion of tin and a minor portion of silver.

8. The method of claim 1, in which said method further comprises employing as said electrical element a film-type resistor on a ceramic substrate, and providing on said attachment region an electrically highly conductive metalization.

9. The method of claim 1, in which said method further comprises preheating said element prior to said directing of said flame at said lead.

10. A method of soldering leads to electrical components, which comprises:
    (a) providing a plurality of identical electrical components in predetermined proximate relationship to each other, and with each component having two spaced-apart attachment regions for leads;
    (b) providing many leads in predetermined spaced-apart relationship to each other, and with such relationship correlated to the positions of said attachment regions of said plurality of proximate components;
    (c) providing an elongate ribbon of solder;
    (d) sandwiching said ribbon between said attachment regions and portions of said leads; and
    (e) heating said lead portions for a sufficient time period and to a sufficient temperature to melt said solder ribbon and cause portions of said ribbon to be drawn toward said respective lead portions to thereby make solder bonds between said lead portions and said attachment regions.

11. The method of claim 10, in which said method further comprises employing as said ribbon of solder a solder ribbon having a coating of flux thereon.

12. The method of claim 10, in which said method further comprises severing said ribbon between said components, and between said leads on each component, prior to said last-named step of melting said ribbon and making said bonds.

13. A method of soldering leads to electrical components, which comprises:
    (a) providing a plurality of electrical components in predetermined proximate relationship to each other, and with each component having two spaced-apart attachment regions for leads;
    (b) providing a multiplicity of leads in predetermined spaced-apart relationship to each other, and with such relationship correlated to the positions of said attachment regions of said plurality of proximate components;
    (c) providing elongate solder means;
    (d) sandwiching said solder means between said attachment regions and end portions of said leads;
    (e) providing a plurality of flame-emitting torch tips in such relationship to each other that flames from said tips can operate substantially simultaneously on or adjacent different ones of said electrical components; and
    (f) operating said plurality of torch tips first to flame-sever said solder means into relatively short sections that protrude from beneath the sides of said lead end portions, and thereafter to flame-heat said lead end portions to temperatures such and for time periods such that said solder means melts and said protruding solder means is drawn to said lean end portions, following which said solder solidifies and bonds said lead end portion to said components.

14. The method of claim 13, in which said last-specified step of operating said plurality of torch tips is performed in such manner that much less heat is delivered to said solder means for said severing than is delivered to said lead end portions for said bonding.

15. The method of claim 13, in which said step of operating said plurality of torch tips is so performed that in one of two first steps, flames from said torch tips melt and thus sever said solder means at regions between said components, and in another of said two first steps, flames from said torch tips melt and thus sever said solder means at regions between the lead end portions on each chip, and in one of two subsequent steps, flames from said torch tips heat one lead end portion on each of said components, and in another of said two subsequent steps, flames from said torch tips heat the other lead end portion on each of said components.

16. The method of claim 13, in which said operating step comprises shifting said plurality of torch tips in predetermined timed sequence in x and z directions.

17. The method of claim 13, in which said method further comprises determining the volume of said solder means, and the distances between said components, in such manner that molted solder from said solder means flows to the immediate vicinity of said lead end portions but not thereover.

18. The method of claim 13, in which said method further comprises supplying the fuel to said torch tips as a mixture of hydrogen and oxygen gases, and further comprises effecting said heating of said lead end portions by moving said torch tips close to them, so that the reducing cores of the flames emanating from said tips are near to said lead end portions.

19. The method of claim 13, in which said method is so performed that said components are spaced short distances from each other, and portions of said solder means that bridge between said components do not rest on anything, but instead hang in air.

20. The method of claim 13, in which said components are film-type resistor chips, and in which extreme end portions of said leads are held over and in light downward-pressing relationships relative to portions of said solder means that rest on metalization pads on said chips.

21. The method of claim 13, in which said components are film-type resistor chips, and in which large portions of said leads lap over said chips above metalization pads thereon, and in which the amount of said lapping is caused to be much larger than the width of said solder means, and in which molten solder is caused to wick or capillate below substantially the entire lapped portions of said leads.

22. The method of claim 13, in which said method further comprises pressing said leads towards said elements during said melting step.

23. The method of claim 13, in which said method further comprises employing as said leads, copper leads plated with nickel, and employing as said solder means a solder ribbon that contains a major portion of tin and a minor portion of silver.

24. The method of claim 13, in which said method further comprises preheating said elements prior to said directing of said flames at said leads.

25. The method of claim 15, in which during both of said two first steps said flames are only close enough to said solder means to effect said severing, and during both of said two subsequent steps said flames are much closer to said solder means than during said two first steps.

26. The method of claim 25, in which said method further comprises causing said flames to be so close to said solder means during both of said subsequent steps that the reducing cores of said flames substantially engage said leads, said flames being hydrogen flames.

27. The method of claim 13, in which said method further comprises causing said leads to have flat upper and lower surfaces parallel to each other.

28. The method of claim 13, in which said method comprises causing said solder means to be a ribbon of solder.

29. The method of claim 13, in which said solder means is precoated with no-clean flux.

30. A method of soldering a lead to an electrical element, which comprises:
(a) providing an electrical element having an attachment region for a lead;
(b) providing a lead having an attachment surface adapted to engage said attachment region;
(c) providing a ribbon of solder having a precoating of flux thereon, said ribbon being much longer than the width of said lead;
(d) sandwiching said ribbon between said attachment region and said attachment surface, and so that a portion of said ribbon extends out instead of being sandwiched between said region and surface;
(e) directing a flame at said ribbon to cut said ribbon near said lead; and
(f) directing a flame at said lead in the vicinity of said attachment surface, at a sufficient temperature and for a sufficient time to melt said ribbon to strongly bond said lead to said element.

31. A method of soldering leads to electrical components, which comprises:
(a) providing an electrical component having at least two spaced-apart attachment regions for leads;
(b) providing at least two leads in predetermined spaced-apart relationship to each other, and with such relationship correlated to the positions of said attachment regions of said component;
(c) providing an elongate ribbon of solder;
(d) sandwiching said ribbon between said attachment regions and portions of said leads; and
(e) heating said lead portions for a sufficient time period and to a sufficient temperature to melt said solder ribbon and cause portions of said ribbon to be drawn toward said respective lead portions to thereby make solder bonds between said lead portions and said attachment regions.

32. A method of soldering leads to electrical components, which comprises:
(a) providing an electrical component having two spaced-apart attachment regions for leads;
(b) providing a plurality of leads in predetermined spaced-apart relationship to each other, and with such relationship correlated to the positions of said attachment regions of said component;
(c) providing elongate solder ribbon means;
(d) sandwiching said solder ribbon means between said attachment regions and end portions of said leads;
(e) providing flame-emitting torch-tip means; and
(f) operating said torch-tip means first to flame-sever said solder ribbon means into relatively short sections that protrude from beneath said lead end portions, and thereafter to flame-heat said lead end portions to temperatures such and for time periods such that said sections of said solder ribbon means melt and bond said portions to said component.

* * * * *